(12) United States Patent
Blöhdorn et al.

(10) Patent No.: US 6,915,743 B2
(45) Date of Patent: Jul. 12, 2005

(54) DEVICE AND METHOD FOR DETECTING THE EDGE OF A RECORDING MATERIAL

(75) Inventors: Gerhard Fritz Blöhdorn, Schönkirchen (DE); Peter Klaus Melzer, Kiel (DE); Heinz Gerhard Franke, Kiel (DE); Volker Haushahn, Kiel (DE)

(73) Assignee: Heidelberger Druckmaschinen Aktiengesellschaft, Heidelberg (DE)

( * ) Notice: Subject to any disclaimer, the term of this patent is extended or adjusted under 35 U.S.C. 154(b) by 25 days.

(21) Appl. No.: 10/695,368

(22) Filed: Oct. 28, 2003

(65) Prior Publication Data

US 2004/0178570 A1 Sep. 16, 2004

(30) Foreign Application Priority Data

Feb. 21, 2003 (DE) .......................................... 103 07 381

(51) Int. Cl.[7] .............................................. B41F 13/16
(52) U.S. Cl. ...................................................... 101/486
(58) Field of Search ............................ 101/401.1, 415.1, 101/463.1, 477, 485, 486, DIG. 36; 271/248, 265.01; 347/262, 264

(56) References Cited

U.S. PATENT DOCUMENTS

| 5,220,177 | A |   | 6/1993 | Harris .......................... 250/548 |
| 5,317,971 | A | * | 6/1994 | Deye et al. .................. 101/486 |
| 6,772,688 | B2 | * | 8/2004 | Argiros et al. ............... 101/477 |
| 6,815,702 | B2 | * | 11/2004 | Kiermeier et al. ..... 250/559.36 |
| 2004/0231543 | A1 | * | 11/2004 | Smythies et al. ........... 101/486 |

FOREIGN PATENT DOCUMENTS

| EP | 0 015 553 A1 | 9/1980 |
| EP | 1 081 458 A2 | 3/2001 |
| EP | 1 087 458 A2 | 3/2001 |

OTHER PUBLICATIONS

Warnecke, H.-J. et al.: "Verfahren und Grossgeräte für Messraum und Betrieb" [Method and Heavy Equipment for Test Labs and Industry], Fertigungsmesstechnik, Handbuch für Industrie und Wissenschaft, Springer Verlag, 1984, pp. 280–283.

* cited by examiner

Primary Examiner—Stephen R. Funk
(74) Attorney, Agent, or Firm—Laurence A. Greenberg; Werner H. Stemer; Ralph E. Locher

(57) ABSTRACT

A device and a method detect an edge of a recording material, in particular a printing plate, in an exposer for recording printing originals. An exposer has an exposure drum for holding the printing plate, and an exposure head, which is moved axially along the exposure drum and focuses exposure beams onto the printing plate. The position of the edge of the printing plate is determined by a sensing device. To this end, a sensing finger is pivoted into a groove in the surface of the exposure drum and a signal is generated by a sensor when the sensing finger moves when it touches the edge of the recording material. The sensor used is preferably a microswitch. The axial position of the edge of the printing plate is determined by counting the cycles of the feed drive that moves the sensing device.

13 Claims, 4 Drawing Sheets

DEVICE AND METHOD FOR DETECTING THE EDGE OF A RECORDING MATERIAL

BACKGROUND OF THE INVENTION

Field of the Invention

The invention relates to the field of electronic reproduction technology and pertains to a device and a method for detecting an edge of a recording material, for example a printing plate, in an exposer for recording printing originals.

In reproduction technology, printing originals for printed pages that contain all the elements to be printed such as texts, graphics and images are produced. For color printing, a separate printing original is produced for each printing ink and contains all the elements that are printed in the respective color. For four-color printing, these are the printing inks cyan, magenta, yellow and black (CMYK). The printing originals separated in accordance with printing inks are also referred to as color separations. The printing originals are generally screened and, by using an exposer, are exposed onto films, with which printing plates for printing large editions are then produced. Alternatively, the printing originals can also be exposed directly onto printing plates in special exposure devices, or they are transferred directly as digital data to a digital printing press. There, the printing-original data is then exposed onto printing plates, for example with an exposing unit integrated into the printing press, before the printing of the edition begins immediately thereafter.

According to the current prior art, the printing originals are reproduced electronically. In this case, the images are scanned in a color scanner and stored in the form of digital data. Texts are generated with text processing programs and graphics with drawing programs. Using a layout program, the image, text and graphic elements are assembled to form a printed page. Following the separation into the printing inks, the printing originals are then present in digital form. The data formats largely used nowadays to describe the printing originals are the page description languages PostScript and portable document format (PDF). In a first step, the PostScript or PDF data is converted in a raster image processor (RIP) into color separation values for the CMYK color separations before the recording of the printing originals. In the process, for each image point, four-color separation values are produced as tonal values in the value range from 0 to 100%. The color separation values are a measure of the color densities with which the four printing inks cyan, magenta, yellow and black have to be printed on the printing material. In special cases, in which printing is carried out with more than four colors (decorative colors), each image point is described by as many color separation values as there are printing inks. The color separation values can be stored, for example, as a data value with 8 bits for each image point and printing ink, with which the value range from 0% to 100% is subdivided into 256 tonal value steps.

The data from a plurality of printed pages is assembled together with the data of further elements, such as register crosses, cut marks and folding marks and print control fields, to form printing originals for a printed sheet. The printed sheet data is likewise provided as color separation values (CMYK).

Different tonal values of a color separation to be reproduced may be reproduced in the print only by surface modulation of the printing inks applied, that is to say by screening. The surface modulation of the printing inks can be carried out, for example, in accordance with a halftone method, in which the various tonal value steps of the color separation data are converted into halftone dots of different size, which are disposed in a regular pattern with periodically repeating halftone cells. During the recording of the color separations on a printing plate, the halftone dots in the individual halftone cells are assembled from exposure points that are an order of magnitude smaller than the halftone dots. A typical resolution of the exposure points is, for example, 1,000 exposure points per centimeter, that is to say an exposure point has the dimensions 10 $\mu$m×10 $\mu$m. Conversion of the color separation values into halftone dots takes place in a second step during the further processing of the color separation data in the raster image processor, as a result of which the color separation data is converted into high-resolution binary values with only two lightness values (exposed or not exposed) which form the pattern of the modulated dot grid. In this way, the printing original data of each color separation is described in the form of a high-resolution halftone bitmap which, for each of the exposure points on the printed area, contains a bit which indicates whether the exposure point is to be exposed or not.

In the recording devices which are used in electronic reproduction technology for the exposure of printing originals and printing forms, for example a laser beam is produced by a laser diode, shaped by an optical device and focused on to the recording material and deflected over the recording material point by point and line by line by a deflection system. There are also recording devices which, in order to increase the exposure speed, produce a bundle of laser beams, for example with a separate laser diode for each laser beam, and expose a plurality of image lines of the printing form simultaneously each time they sweep across the recording material. The printing forms can be exposed onto the film material, so that what are known as color separation films are produced, which are then used for the production of printing plates by a photographic copying process. Instead, the printing plates themselves can also be exposed in a plate exposer or directly in a digital printing press, into which a unit for exposing plates is integrated. The recording material can be located on a drum (external drum exposer), in a cylindrical hollow (internal drum exposer) or on a flat surface (flatbed exposer).

In the case of an external drum exposer, the material to be exposed, in the form of films or printing plates, is mounted on a drum mounted such that it can rotate. While the drum rotates, an exposure head is moved axially along the drum at a relatively short distance. The exposure head focuses one or more laser beams onto the drum surface, sweeping over the drum surface in the form of a narrow helix. In this way, during each drum revolution, one or more image lines are exposed onto the recording material.

In the case of an internal drum exposer, the material to be exposed is mounted on the inner surface of a partly open hollow cylinder and exposed with a laser beam that is aimed along the cylinder axis onto a deflection device that reflects the laser beam perpendicularly onto the material. The deflection device, a prism or a mirror, rotates at high speed during operation and, at the same time, is moved in the direction of the cylinder axis, so that the deflected laser beam describes circular or helical image lines on the material.

Flatbed exposers operate for the most part with a rapidly rotating polygonal mirror, whose mirror surfaces deflect the laser beam transversely over the recording material, while at the same time the recording material is moved at right angles to the deflection direction of the laser beam. In this way, exposure is carried out image line by image line. Since, during the movement of the laser beam over the recording material, the length of the light path changes, complicated imaging optics are required which compensate for the size changes of the exposure point caused by the change.

Irrespective of the configuration of the exposer, the laser beams are not modulated with a continuously varying signal during the exposure of the printing originals, but are switched on and off on the basis of a binary image signal obtained from the halftone bitmap, so that a pattern of halftone dots corresponding to the halftone bitmap is recorded.

During the exposure of the printing originals, care must be taken that the position of the exposed surface, as related to the edges of the recording material or as related to the holes punched in the leading edge, is always the same for all color separations of a printed sheet, since the color separations are subsequently to be printed over one another coincidentally in the press. The punched holes in the printing plates are used for correct positioning when the printing plates are clamped onto the plate cylinder in the press. The position of the exposed surface and the position of the punched holes are determined in relation to a leading edge and one or both side edges of the recording material.

The tolerance of the remaining displacement between the color separations should be less than 25 $\mu$m. The always constant relationship to the leading edge is ensured, for example, by contact pins against which the leading edge of the recording material is placed as the material is clamped into the exposure device before the exposure. In the process, however, as a result of mechanical tolerances on the clamping device, lateral displacement of the recording material can occur. It is therefore necessary to determine the exact position of the side edges after the clamping, in order that the edge positions determined in this way can be set into a relationship with the position of the exposure head at the start of the exposure. By an appropriate displacement of the starting point of the exposure, the lateral displacement caused during clamping can be compensated for, so that the position of the exposed surface is also always constant in relation to the side edges of the recording material. The position of the side edge should be determined with an accuracy of about 5 $\mu$m since otherwise, as a result of the addition of individual errors in the further process, the register error of the color separations in the final print can become too large.

In Published, European Patent Application EP 0 015 553 A1, a description is given of a device in a printer for detecting the side edge of a printing medium which is clamped onto a printing roll, in which a light beam is aimed at the printing roll and the printing medium. While the light beam is moved along the printing roll in the axial direction, the intensity of the reflected light is measured. Assuming that the surface of the printing roll and the printing medium have different reflective properties, the position of the edge of the printing medium can be determined.

In Published, European Patent Application EP 1 081 458 A2, a description is given of a device in a printing-plate exposer for detecting the side edge of a printing plate that is clamped on an exposure drum. A laser diode feeds light into an optical fiber, which aims the light radially onto the exposure drum and the printing plate. Using a lens configuration, the light is focused onto the surface of the printing plate. Disposed beside the optical fiber which emits light is an optical fiber which picks up light and which is connected to a photodetector. Using the same lens configuration, the reflected light is focused onto the end face of the receiving optical fiber. Because of the thickness of the printing plate, a difference in height between the surface of the exposure drum and the surface of the printing plate results, and the emitted light is defocused when it strikes the exposure drum. As a result, a greater amount of light is reflected into the receiving optical fiber than if the emitted light strikes the printing plate. Because of the difference in the amount of reflected light, the position of the edge of the plate can be detected if the configuration is moved axially along the exposure drum. Since the detection is based on the difference in height, the edge is also detected when the surfaces of the exposure drum and printing plate have the same reflective properties.

U.S. Pat. No. 5,220,177 A describes a device for detecting the edges of a strip-like, opaque or semitransparent material. Disposed underneath the material is an array of light-emitting diodes (LED), which projects beyond the strip material on both sides. The LEDs have a spacing of about 2.5 mm from one another. A photodetector is disposed above the material. The LEDs are switched on one after another, the light from the LEDS that are located in the vicinity of one edge being partly or wholly covered by the strip material. As a result, the signal in the photodetector is attenuated more the closer the LED is to the edge. Following filtering and smoothing of the attenuation curve, the position of the edge can be determined more accurately than corresponds to the spacing of the LEDs.

The known methods for detecting and determining the position of the edge of a recording material are constructionally complicated or they do not achieve the required accuracy and reproducibility. The use of a forked light barrier requires the edge of the recording material to penetrate the gap in the light barrier. However, since the recording material is already clamped onto a holding surface of the exposer during the measurement, a relatively wide depression has to be introduced into the holding surface, in which depression one half of the light barrier moves. As a result, there is the danger that the recording material will curve in toward the holding surface there.

The use of a measuring device that evaluates light reflected from the edge of the recording material is not reliable and reproducible enough, depending on the condition of the edge. An edge of a printing plate can deviate from the perpendicular by a first tolerance band, caused by the tool with which the printing plate was cut to size. As a result, the reflection behavior changes with respect to an ideal perpendicular edge. The cutting tool also causes grooves, as a result of which the edge deviates from an ideal straight line in a second tolerance band. Finally, at the upper margin of the edge, the coating is damaged or flaked off in a third tolerance band, so that in this region the reflection properties are not defined unambiguously. The typical magnitudes of the three tolerance bands are, for example, first=70 $\mu$m, second=20 $\mu$m, third=100 $\mu$m. These tolerances are therefore so great that the edge measurement with reflected light becomes too unsafe and too inaccurate.

An edge measurement with optical or inductive and capacitive sensors, which measure the distance between the sensor and the surface of the recording material or the supporting surface for the recording material and detect the edge from the change in this distance, is problematical, since such sensors operate with a relatively large measurement point diameter. The required accuracy and reproducibility of the edge measurement can therefore be met only with difficulty.

The conventional devices for detecting the edge of a recording material require a complicated optical and mechanical configuration and considerable expenditure for the electronic evaluation of the measured signal, in order to meet the requirements for the accuracy and reproducibility of the edge measurement. In the case of some devices, it is also disadvantageous that light is aimed onto the recording material in order to evaluate the reflected light. As a result, light-sensitive material can be exposed in a disruptive manner, even if, as a precaution, use were made of sensor light whose wavelength lies outside the spectral sensitivity range of the recording material.

SUMMARY OF THE INVENTION

It is accordingly an object of the invention to provide a device and a method for detecting the edge of a recording material that overcome the above-mentioned disadvantages of the prior art devices and methods of this general type, which can advantageously be used during the recording of printing originals.

With the foregoing and other objects in view there is provided, in accordance with the invention, a device for detecting an edge of a printing plate in an exposer for recording printing originals. The device contains an exposure drum for holding the printing plate and having a surface with a groove formed therein. An exposure head is provided and is movable axially along the exposure drum and focuses exposure beams onto the printing plate. A sensing device is provided and has a sensing finger that can be pivoted into the groove.

The sensing device further has a sensor outputting a signal when the sensing finger moves after touching the edge of the printing plate. The sensor is a light barrier or a microswitch.

In accordance with an added feature of the invention, there is a fixed connection between the sensing device and the exposure head.

In accordance with a further feature of the invention, the sensing device has three contact points and a pivot connected firmly to the sensing finger. The sensing finger and the pivot bear on the three contact points in an engaged position. Preferably, a driver pin is driven by a motor and presses the sensing finger and the pivot against the three contact points.

In accordance with an additional feature of the invention, the sensing device has three contact points projecting from the sensing finger, a contact plate, a rotary arm, a motor, and a joint connecting the sensing finger to the rotary arm. The rotary arm is driven by the motor and presses the sensing finger with the three contact points against the contact plate.

In accordance with another feature of the invention, the exposer is an external drum exposer.

With the foregoing and other objects in view there is provided, in accordance with the invention, a method for detecting an edge of a printing plate in an exposer for recording printing originals. The method includes the steps of providing an exposure drum for holding the printing plate, providing an exposure head to be moved axially along the exposure drum and focuses exposure beams onto the printing plate, pivoting a sensing finger into a groove formed in a surface of the exposure drum, and generating, using a sensor, a signal when the sensing finger moves after touching the edge of the recording material.

In accordance with an added mode of the invention, there is the step of providing a feed drive for moving the sensing finger and the sensor axially along the exposure drum.

In accordance with another mode of the invention, there is the step of determining an axial position of the edge of the printing plate by counting cycles of the feed drive.

Other features which are considered as characteristic for the invention are set forth in the appended claims.

Although the invention is illustrated and described herein as embodied in a device and a method for detecting the edge of a recording material, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
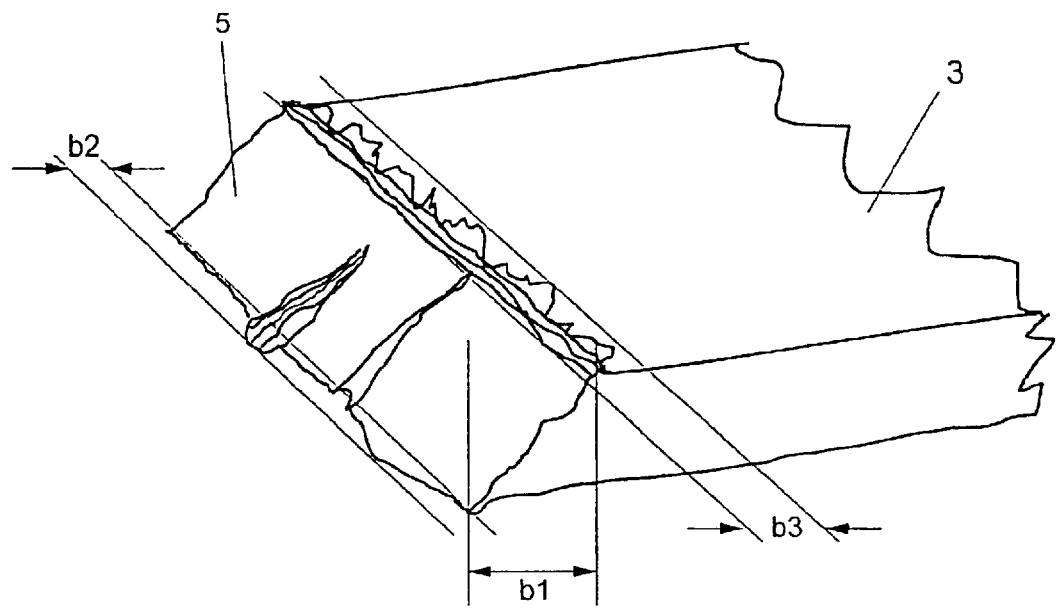
FIG. 1 is a diagrammatic, perspective view of a detail of an edge of a printing plate.

Referring now to the figures of the drawing in detail and first, particularly, to FIG. 1 thereof, there is shown an enlarged detail of a left-hand side edge 5 of a printing plate 3. The edge 5 can deviate from the perpendicular by a tolerance band b1, caused by the tool with which the printing plate 3 was cut to size. As a result, the reflection behavior changes with respect to an ideal perpendicular edge. The cutting tool also causes grooves, as a result of which the edge 5 deviates from an ideal straight line in a tolerance band b2. Finally, at the upper margin of the edge 5, the coating is damaged or flaked off in a tolerance band b3, so that in this region the reflection properties are not defined unambiguously. The typical magnitudes of the three tolerance bands are, for example, b1=70 $\mu$m, b2=20 $\mu$m, b3=100 $\mu$m. These tolerances are therefore so great that the edge measurement with reflected light becomes too unsafe and too inaccurate.

Figure 2:
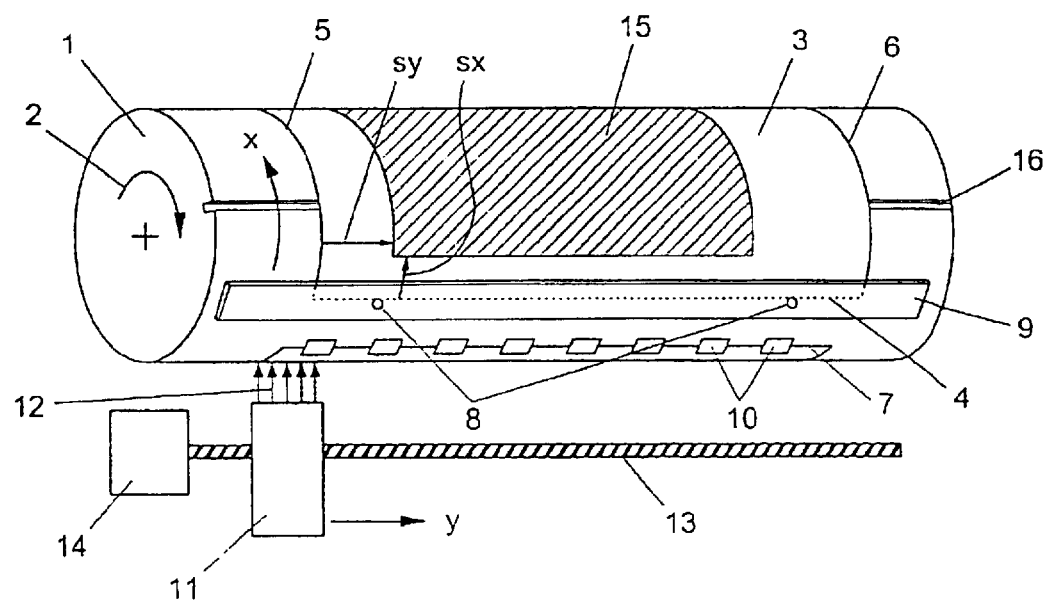
FIG. 2 is a perspective view of an external drum exposer.

FIG. 2 shows the basic construction of an external drum exposer. An exposure drum 1 is mounted such that it can rotate, and can be set into a uniform rotational movement in the direction of a rotation arrow 2 by a non-illustrated rotational drive. Clamped onto the exposure drum 1 is an unexposed, rectangular printing plate 3, which has a leading edge 4, a left-hand side edge 5, a right-hand side edge 6 and a trailing edge 7. The printing plate 3 is clamped on in such a way that its leading edge 4 touches contact pins 8 which are firmly connected to the exposure drum 1 and project beyond the surface of the exposure drum 1. A clamping strip 9 presses the leading edge 4 firmly onto the surface of the exposure drum 1 as well and, as a result, fixes the leading edge 4 of the printing plate 3. The printing plate 3 is held flat on the drum surface by a non-illustrated vacuum device, which attracts the printing plate 3 by suction through holes in the drum surface, in order that the printing plate 3 is not loosened by the centrifugal forces during the rotation.

Additionally, the trailing edge 7 of the printing plate 3 is fixed by clamping pieces 10.

An exposure head 11 is moved axially along the exposure drum 1 at a relatively short distance as the exposure drum 1 rotates. The exposure head 11 focuses one or more laser beams 12 onto the drum surface, which sweep over the drum surface in the form of narrow helices. In this way, during the drum revolution, one or more image lines are exposed onto the recording material in the circumferential direction x. The exposure head 11 is moved in the feed direction y by a feed spindle 13, to which it is connected by a form fit and which is set moving rotationally by a feed drive 14. The feed drive 14 is preferably constructed with a stepping motor. By counting the stepping motor cycles, starting from a known reference position, the current axial y position of the exposure head 11 can be determined very accurately. Alternatively, a non-illustrated rotary encoder can be fitted to a rotational shaft of the feed drive 14 and, after a specific rotational angle increment of the feed spindle 13, generates a cycle signal in each case. By counting the cycles, the y position of the exposure head 11 can likewise be determined.

A printing original 15 to be exposed on the printing plate 3 covers only part of the total recording area that is available. However, for all the color separations which are exposed one after another on different printing plates 3, the printing original 15 must always have the same position in relation to the edges of the printing plate 3, in order that no register errors occur later during the overprinting of the color separations, that is to say a distance sx of the front edge of the printing original 15 from the leading edge 4 of the printing plate 3, and a distance sy of the left-hand edge of the printing original 15 from the left-hand side edge 5 of the printing plate 3 must be the same for all the color separations. Since the edges of the printing plate 3 are not ideally straight, the position of the printing original 15 to be exposed is determined during accurate observation with reference to three points on the edges, two points on the leading edge 4, where the contact pins 8 touch the leading edge 4, and one point on a side edge, where a corresponding measuring device determines the position of the side edge. By axial precentering of the printing plate 3, not shown in FIG. 2, as the printing plate 3 is clamped onto the exposure drum 1, care is taken that, in the case of all the printing plates of the same format, the printing plate 3 touches the contact pins 8 within a tolerance band substantially at the same points on the leading edge 4. In addition, the measurement of the side edge is carried out at the same point on the side edge in the case of all printing plates. These three points are likewise used as reference points in further units in which the printing plate 3 is processed, for example in a plate punch.

The maintenance of the distance sx is achieved by the printing plate 3 being placed on the contact pins 8 when it is clamped onto the exposure drum 1 and, starting from this known circumferential position, the starting point of the exposure for the image lines is displaced in the x direction by the distance sx. The displacement is carried out, for example, by counting circumferential cycles, which are derived from a rotary encoder not shown in FIG. 2 but connected to the drum axle.

In maintaining the distance sy, the problem arises that the printing plate 3 can experience a small displacement in the y direction as it is clamped onto the exposure drum 1, as a result of mechanical tolerances in the clamping device. In order to be able to maintain the distance sy accurately, it is therefore necessary to determine the precise position of the left-hand side edge 5 of the printing plate 3 after it has been clamped in. The edge position determined can then be set into a relationship with the position of the exposure head 11 and, by an appropriate displacement of the starting point of the exposure in the y direction, the axial displacement of the printing plate 3 caused during the clamping can be compensated for. The determination of the correct starting point for the exposure is done by counting the cycles with which the feed drive 14 is controlled.

Figure 3:
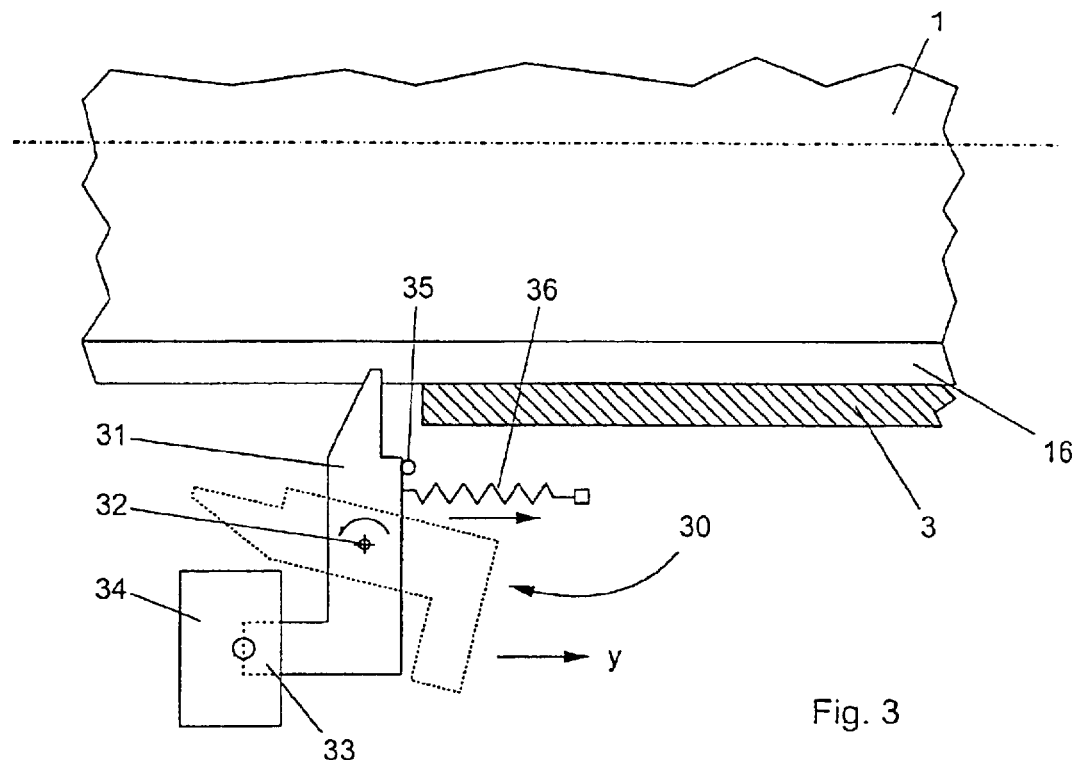
FIG. 3 is a sectional view of a first solution for a sensing device.

According to the device of the invention and for the method for determining the position of a side edge of the printing plate 3, a sensing device 30 with a sensing finger 31 is provided, which can be pivoted into a narrow groove 16 in the surface of the exposure drum 1, extending in the axial direction of the exposure drum 1. In this regard, FIG. 3 shows a first solution in a longitudinal sectional view of the exposure drum 1. When the exposure drum 1 is at a standstill, the sensing finger 31, which is mounted such that it can rotate about a pivot or pivot point 32, is pivoted into the groove 16. It is held in this position by being pressed against a stop pin 35 by a spring force 36. If the position of the edge is not measured, the sensing finger 31 is pivoted out of the groove 16, in order that it cannot damage the surface of the printing plate 3. The pivoted-out position is shown by dashed lines in FIG. 3. At one end, the sensing finger 31 is provided with a flag 33 which, when the sensing finger 31 is pivoted in, projects into the light gap of a forked light barrier 34. The entire sensing device 30 is firmly connected to the exposure head 11 and, by the feed drive 14, is moved axially along the exposure drum 1 in the y direction together with the exposure head 11. As soon as the sensing finger 31 touches the edge of the printing plate 3, the sensing finger rotates a little during the onward movement of the sensing device 30, so that the flag 33 moves out of the light path of a light barrier 34 and outputs an electrical signal. The sensing device 30 moves toward the edge of the plate in very small steps, for example by 0.2 $\mu$m for each cycle of the feed drive 14. By counting the cycles, the y position at which the signal is output can be determined, and thus the position of the edge of the printing plate 3 can be determined.

Figure 4:
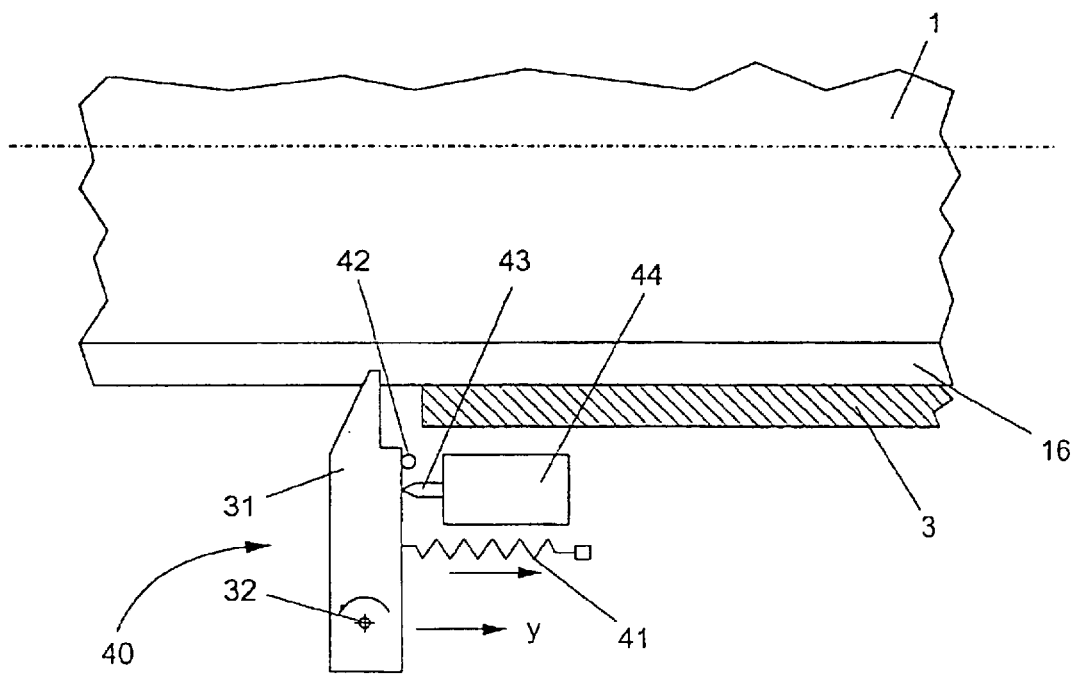
FIG. 4 is a sectional view of a second solution for the sensing device.

FIG. 4 shows a further solution for the device according to the invention. The sensing finger 31, which is mounted such that it can rotate about the pivot point 32, is pivoted into the groove 16 in order to measure the edge of the printing plate 3. If the position of the edge is not measured, the sensing finger 31 is pivoted out of the groove 16. The pivoted-out position is not illustrated in FIG. 4, for improved clarity. The sensing finger 31 is pressed against a stop pin 42 by a spring force 41, as a result of which the sensing finger 31 presses the switching pin 43 of a microswitch 44 in. The entire sensing device 40 is firmly connected to the exposure head 11 and is moved axially along the exposure drum 1 in the y direction together with the exposure head 11 by the feed drive 14. After the sensing finger 31 has touched the edge of the printing plate 3, the sensing finger rotates a little, so that the switching pin 43 is pivoted out of the microswitch 44 by a spring present in the microswitch 44 and closes an electrical contact. By counting the cycles of the feed drive 14, the y position at which the contact is closed can be determined, and therefore the position of the edge of the plate can be determined. The microswitch 44 is preferably a precision switch which already closes and opens the contact at a switching travel of 1 . . . 2 $\mu$m of the switching pin 43.

Figure 5:
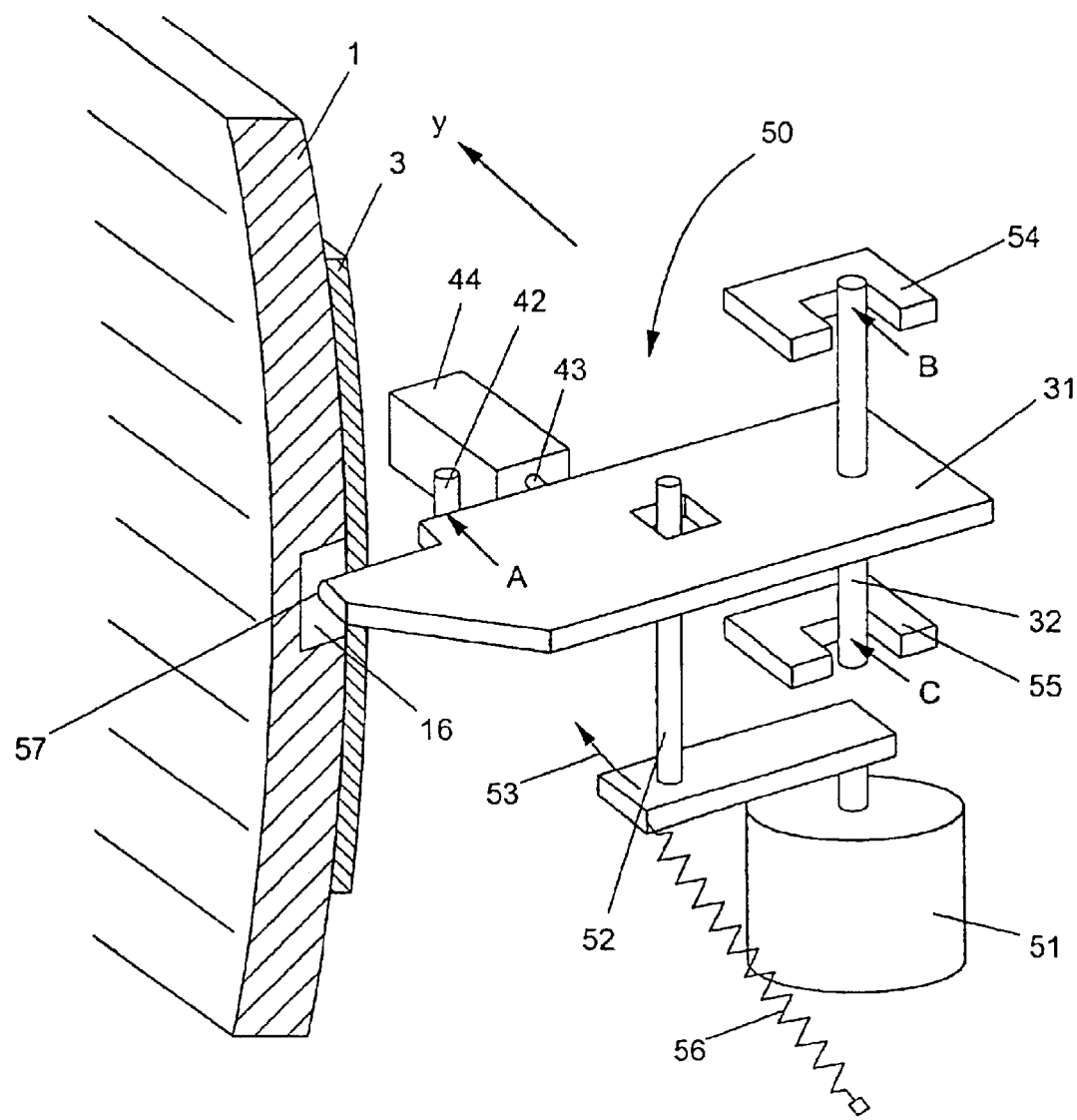
FIG. 5 is a perspective view of a first embodiment of the sensing device.

FIG. 5 shows a sensing device 50 as a preferred embodiment of the solution according to FIG. 4. A perspective view of a detail of the exposure drum 1 with the incorporated groove 16 and the printing plate 3 clamped on is illustrated. The sensing finger 31 and the pivot 32 are connected firmly to each other. The ends of the pivot 32 are mounted such that they can rotate in non-illustrated bearings. A motor 51 moves a driver pin 52 in the direction of arrow 53 via a crank connection. The driver pin 52 engages approximately in the center of the sensing finger 31 and presses the sensing finger 31 against the stop pin 42 at a first contact point A and the pivot 32 against defined stop surfaces 54 and 55 at two further contact points B and C. The three contact points are identified by the arrows A, B and C. The motor 51 is preferably a torque-producing motor that, even at a standstill, exerts a torque that can be adjusted by the current flow. When the sensing finger 31 pivots into the groove 16, the current of the motor 51 is increased in accordance with a ramp function, as a result of which the sensing finger 31 rotates slowly into the pivoted-in position, until it touches the stop pin 42. This prevents the sensing finger 31 or the stop pin 42 from being deformed or worn by striking the stop finger 42 too hard, so that the accuracy and reproducibility of the measurement would be impaired. After the pivoting-in action, the motor 51 presses the sensing finger 31 with a constant torque against the stop pin 42 counter to the pulling force of a restoring spring 56, and therefore satisfies the function of the spring force 41 (FIG. 4). With the constant torque from the motor 51, a defined force is also exerted on the edge of the printing plate 3 as soon as the sensing finger 31 touches the edge. A rounded portion 57 of the sensing finger 31 in the region in which it touches the edge of the plate is a further precondition for the defined and always identical force which the sensing finger 31 exerts on the edge of the plate. The motor 51 is rotated in the direction opposite to the arrow 53 when the sensing finger 31 is to be pivoted out of the groove 16.

If the sensing device 50 is moved along the drum in the y direction and the sensing finger 31 strikes the edge of the printing plate 3, the sensing finger 31 is raised only at the contact point A. The contact points B and C continue to bear, since the pivot 32 is pressed against the contact surfaces 54 and 55 by the driver pin 52. By use of the three contact points A, B and C and the surface quality of the associated contact surfaces, in conjunction with the spring action of the motor 51, the necessary precision and reproducibility of the sensing device 50 in the range of a few microns is achieved. This accuracy is achieved without play-free mounting of the pivot 32 of the sensing finger 31 being needed.

Figure 6:
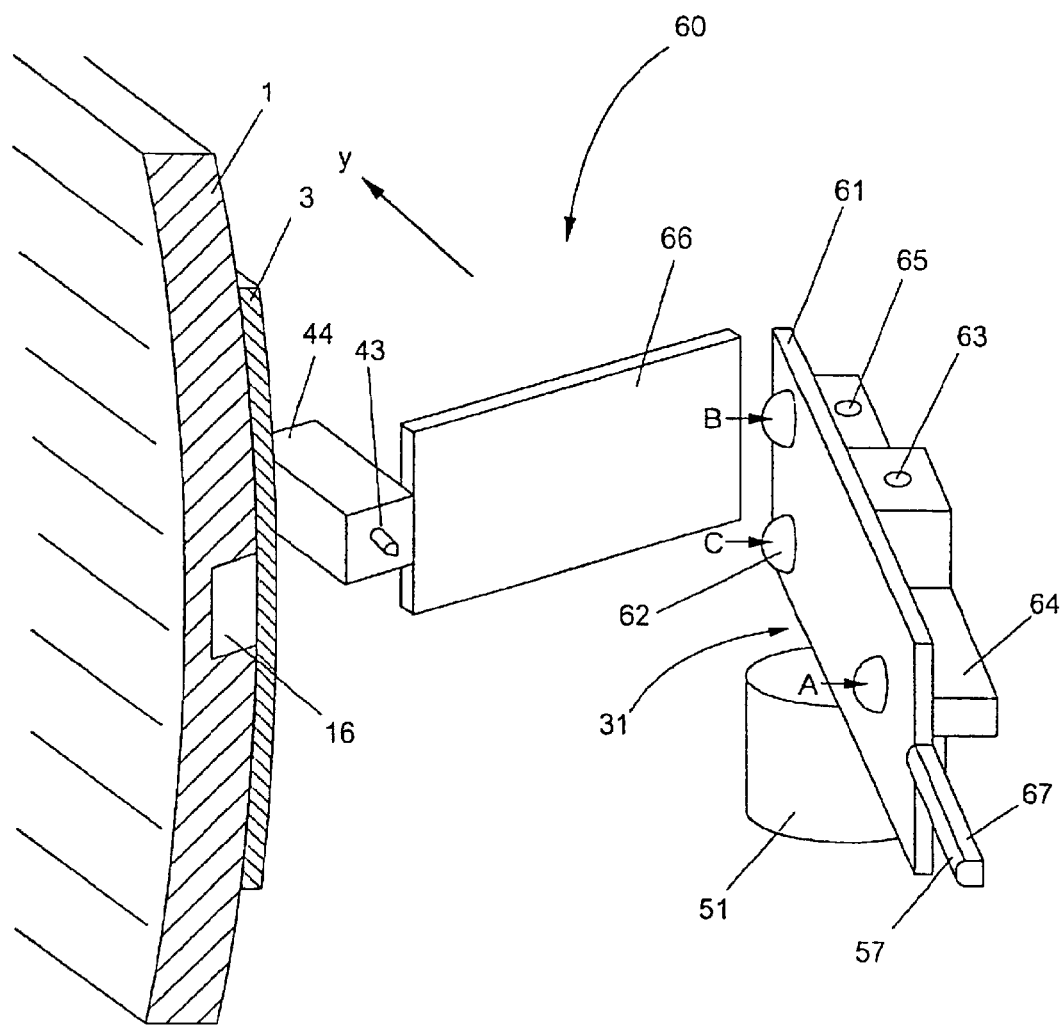
FIG. 6 is a perspective view of a second embodiment of the sensing device.

FIG. 6 shows a sensing device 60 as an alternative embodiment to the solution according to FIG. 4. The sensing finger 31 is shown in the pivoted-out position for reasons of improved clarity. It contains a plate 61, to which three hemispherical elements 62 are fitted as contact points A, B and C. The plate 61 is connected via a movable joint 63 to a rotary arm 64, which is in turn firmly connected to a rotary shaft 65 of the motor 51. The joint 63 can move somewhat in all spatial directions, so that after the sensing finger 31 has been pivoted into the groove 16, all the contact points bear reliably on a contact plate 66. The joint 63 is fitted approximately at the center of the three contact points A, B and C, in order that the force exerted by the rotary arm 64 on the sensing finger 31 is distributed uniformly over the three contact points. In the pivoted-in position of the sensing finger 31, the front part of the plate 61 presses the switching pin 43 of the microswitch 44 in, and an extension 67 with the rounded portion 57 on its front edge projects into the groove 16. With the sensing device 60, too, the required accuracy and repeatability when measuring the position of the edge of a printing plate are achieved only by the three contact points A, B and C and the associated contact plate 66, without play-free mounting of the motor shaft 65 being needed.

In order not to have to carry out any adjustment of the microswitch 44 and of the stop pin 42 and the contact plate 66 in relation to one another with an accuracy in the micrometer range, in the case of the sensing devices 50 and 60, the microswitch 44 is mounted in such a way that its switching pin 43 is pressed in to a sufficient extent when the sensing finger 31 is resting on the three contact points A, B and C. The entire sensing unit is then calibrated, by determining in a measuring device the travel that the tip of the sensing finger 31, which subsequently touches the edge of the printing plate 3, has to trace in the direction counter to the y direction until the contact of the microswitch 44 closes. The measured distance is stored in the control system of the exposer after installation in the exposer and included in the calculation as a correction value when determining the exact position of the edge of the plate. However, the correction value can also be determined without an external calibration device by a simple test exposure, the position of the edge of the plate being determined first with the sensing device 50 or 60 without the correction value. Following the test exposure, the amount by which the exposed area has been displaced in the y direction with respect to the desired position is measured on the recording material. The difference is the correction value.

If, in various units in which the printing plate 3 is processed, for example in an exposer and in a plate punch, the edge of the plate is in each case measured by one of the sensing devices 40; 50; 60 described, for a high accuracy of the measurement it is necessary to take care that the rounded portion 57 of the sensing finger 31 and the contact force on the edge of the plate are identical in all cases. In addition, in all the units, the point on the side edge at which the sensing finger 31 touches the printing plate 3 must be equally far away from the leading edge 4.

In the above text, the device and the method were explained using the example of an external drum exposer for printing plates. However, in principle, the device and the method can likewise be applied to internal drum exposers or flatbed exposers and also to other recording materials, it merely being necessary for details of the constructional implementation to be adapted.

We claim:

1. A device for detecting an edge of a printing plate in an exposer for recording printing originals, comprising:
   an exposure drum for holding the printing plate and having a surface with a groove formed therein;
   an exposure head to be moved axially along said exposure drum and focuses exposure beams onto the printing plate; and
   a sensing device having a sensing finger that can be pivoted into said groove, said sensing device further having a sensor outputting a signal when said sensing finger moves after touching the edge of the printing plate.

2. The device according to claim 1, wherein said sensor is a light barrier.

3. The device according to claim 1, wherein said sensor is a microswitch.

4. The device according to claim 3, wherein said sensing device has three contact points and a pivot connected firmly to said sensing finger, said sensing finger and said pivot bear on said three contact points in an engaged position.

5. The device according to claim 4, further comprising:
   a motor; and
   a driver pin being driven by said motor and pressing said sensing finger and said pivot against said three contact points.

6. The device according to claim 3, wherein said sensing device has three contact points projecting from said sensing finger.

7. The device according to claim 6, wherein said sensing device contains:
- a contact plate;
- a rotary arm;
- a motor; and
- a joint connecting said sensing finger to said rotary arm, said rotary arm being driven by said motor and presses said sensing finger with said three contact points against said contact plate.

8. The device according to claim 1, further comprising a fixed connection between said sensing device and said exposure head.

9. The device according to claim 1, wherein the exposer is an external drum exposer.

10. A method for detecting an edge of a printing plate in an exposer for recording printing originals, which comprises the steps of:

providing an exposure drum for holding the printing plate;

providing an exposure head to be moved axially along the exposure drum and focuses exposure beams onto the printing plate;

pivoting a sensing finger into a groove formed in a surface of the exposure drum; and generating, using a sensor, a signal when the sensing finger moves after touching the edge of the printing plate.

11. The method according to claim 10, which further comprises providing a feed drive for moving the sensing finger and the sensor axially along the exposure drum.

12. The method according to claim 11, which further comprises determining an axial position of the edge of the printing plate by counting cycles of the feed drive.

13. The method according to claim 11, which further comprises forming the exposer as an external drum exposer.

* * * * *